(12) United States Patent
Chun

(10) Patent No.: US 7,937,629 B2
(45) Date of Patent: May 3, 2011

(54) SEMICONDUCTOR MEMORY APPARATUS HAVING NOISE GENERATING BLOCK AND METHOD OF TESTING THE SAME

(75) Inventor: Jun-Hyun Chun, Gyeonggi-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 1168 days.

(21) Appl. No.: 11/641,854

(22) Filed: Dec. 20, 2006

(65) Prior Publication Data

US 2007/0258299 A1 Nov. 8, 2007

(30) Foreign Application Priority Data

Apr. 6, 2006 (KR) .................. 10-2006-0031617

(51) Int. Cl.
- G11C 29/00 (2006.01)
- G11C 7/00 (2006.01)
- G01R 35/00 (2006.01)
- G01R 31/26 (2006.01)

(52) U.S. Cl. ........ 714/718; 702/111; 324/763; 324/765; 365/201

(58) Field of Classification Search .................. 714/718; 702/111; 324/763, 765; 365/201
See application file for complete search history.

(56) References Cited

U.S. PATENT DOCUMENTS

| | | | | |
|---|---|---|---|---|
| 3,736,570 A * | 5/1973 | Hendrickson | ............ | 365/189.08 |
| 4,556,840 A * | 12/1985 | Russell | ......................... | 714/738 |
| 4,673,871 A * | 6/1987 | Brown et al. | ............... | 324/76.11 |
| 5,883,521 A * | 3/1999 | Nishikawa | ..................... | 324/765 |
| 6,166,997 A | 12/2000 | Dussault et al. | | |
| 6,243,309 B1 | 6/2001 | Shin | | |
| 6,262,928 B1 * | 7/2001 | Kim et al. | ...................... | 365/201 |
| 6,304,503 B1 * | 10/2001 | Akamatsu et al. | ............ | 365/201 |
| 6,314,036 B1 * | 11/2001 | Cooper et al. | ................. | 365/201 |
| 6,429,676 B1 * | 8/2002 | Chun et al. | ..................... | 324/765 |
| 6,449,753 B1 * | 9/2002 | Aingaran et al. | .................. | 716/5 |
| 6,636,998 B1 | 10/2003 | Lee et al. | | |
| 6,653,882 B2 * | 11/2003 | Raychaudhuri | ............... | 327/270 |
| 6,671,836 B1 * | 12/2003 | Lai et al. | ....................... | 714/718 |
| 6,823,293 B2 * | 11/2004 | Chen et al. | ..................... | 702/191 |
| 6,996,753 B2 * | 2/2006 | Cho | ................................ | 714/718 |
| 7,007,252 B2 * | 2/2006 | Gyure et al. | ....................... | 716/5 |
| 7,064,991 B2 * | 6/2006 | Maeda | .......................... | 365/201 |
| 7,177,772 B2 * | 2/2007 | Largey et al. | ................... | 702/65 |
| 7,667,477 B2 * | 2/2010 | Nagata | .......................... | 324/763 |
| 7,679,394 B2 * | 3/2010 | Aoki | ............................ | 324/771 |
| 2007/0183231 A1 * | 8/2007 | Kothandaraman et al. | ... | 365/200 |

FOREIGN PATENT DOCUMENTS

| | | |
|---|---|---|
| JP | 2005056529 | 3/2005 |
| JP | 2005317127 | 10/2005 |
| KR | 1020000043490 A | 7/2000 |
| KR | 1020010085537 | 9/2001 |
| KR | 1020060000273 A | 1/2006 |

* cited by examiner

*Primary Examiner* — John J Tabone, Jr.
(74) *Attorney, Agent, or Firm* — Venable LLP; Jeffri A. Kaminski

(57) ABSTRACT

Disclosed are a semiconductor memory apparatus and a method of testing the same. The semiconductor memory apparatus includes memory banks, each of which includes a plurality of memory cells, a peripheral circuit unit that includes a plurality of circuit groups around the memory banks, and a noise generating block that is disposed in the peripheral circuit unit and selectively applies a noise to the memory banks in a test mode.

17 Claims, 4 Drawing Sheets

SEMICONDUCTOR MEMORY APPARATUS HAVING NOISE GENERATING BLOCK AND METHOD OF TESTING THE SAME

BACKGROUND OF THE INVENTION

1. Technical Field

The present invention relates to a semiconductor memory apparatus and a method of testing the same. In particular, the present invention relates to a semiconductor memory apparatus having a noise generating block that provides a noise environment equivalent to a normal mode even in a test mode, and a method of testing the same.

2. Related Art

In general, the quality of semiconductor memory apparatus is determined through a test operation. The test operation is generally performed in a compress test mode. In contrast to a normal mode in which data input/output operations of the memory banks are separately performed, the compress test mode is a test mode in which a data input/output test is performed on a plurality of memory banks at the same time in order to improve time efficiency in the data input/output test of the semiconductor memory apparatuses.

However, in the semiconductor memory, the amount of input/output data in the normal mode may be different from the amount of input/output data in the test mode. Correspondingly, the amount of noise in the compress test mode may be different from the amount of noise in the normal mode. Furthermore, conditions, such as the operating frequency of a clock and the like, can be different between a wafer test step that generally uses the compress test mode and a test step after a packaging process that generally uses the normal mode. Therefore, a difference in the amount of noise between the test mode and the normal mode is generated.

As such, in case amount of noise generated in the wafer test step of the semiconductor memory apparatuses is different from the amount of noise generated in the test step after the packaging process, the percentage of defects increases due to the difference in test conditions when the semiconductor memory apparatuses are manufactured.

SUMMARY OF THE INVENTION

The present invention provides a semiconductor memory apparatus that is capable f providing a noise environment equivalent to a normal mode even in a test mode to thereby reduce the percentage of defects, and a test method using the same.

According to an aspect of the present invention, there is provided a semiconductor memory apparatus that includes memory banks, each of which includes a plurality of memory cells; a peripheral circuit unit that includes a plurality of circuit groups around the memory banks; and a noise generating block that is disposed in the peripheral circuit unit and selectively applies a noise to the memory banks in a test mode.

The noise generating block may include a command decoder that decodes a plurality of commands, a control unit that generates a noise test control signal according to an output signal of the command decoder, and a noise generating unit that generates a current according to whether the noise test control signal of the control unit is enabled or not.

The noise generating unit may include a delay unit that controls the speed of the noise test control signal which is supplied, and a current generating unit that generates a current between a first voltage terminal and a second voltage terminal according to the input of the noise test control signal that is supplied from the delay unit. Further, the current generating unit may include a plurality of sub current generating units that generate a current between the first voltage terminal and the second voltage terminal.

According to another embodiment of the present invention, there is provided a semiconductor memory apparatus that includes memory banks, each of which includes a plurality of memory cells; a peripheral circuit unit that includes a plurality of circuit groups around the memory banks; and a noise generating block that is disposed in the peripheral circuit unit, which includes a command decoder decoding a plurality of commands, a control unit generating a noise test control signal according to an output signal of the command decoder, and a noise generating unit generating a current according to whether the noise test control signal of the control unit is enabled or not. Herein, the noise generating unit includes a delay unit that controls the speed of the noise test control signal which is supplied, and at least one transistor that generates a current between a first voltage terminal and a second voltage terminal according to the input of the noise test control signal supplied from the delay unit.

According to another embodiment of the present invention, there is provided a method of testing a semiconductor memory apparatus that includes, at the time of a wafer test of the semiconductor memory apparatus, generating a noise test control signal by decoding a plurality of commands, and generating a noise by allowing a through-current to flow through a transistor that performs a switching operation according to whether the noise test control signal is enabled or not.

DESCRIPTION OF EXEMPLARY EMBODIMENT

Figure 1:
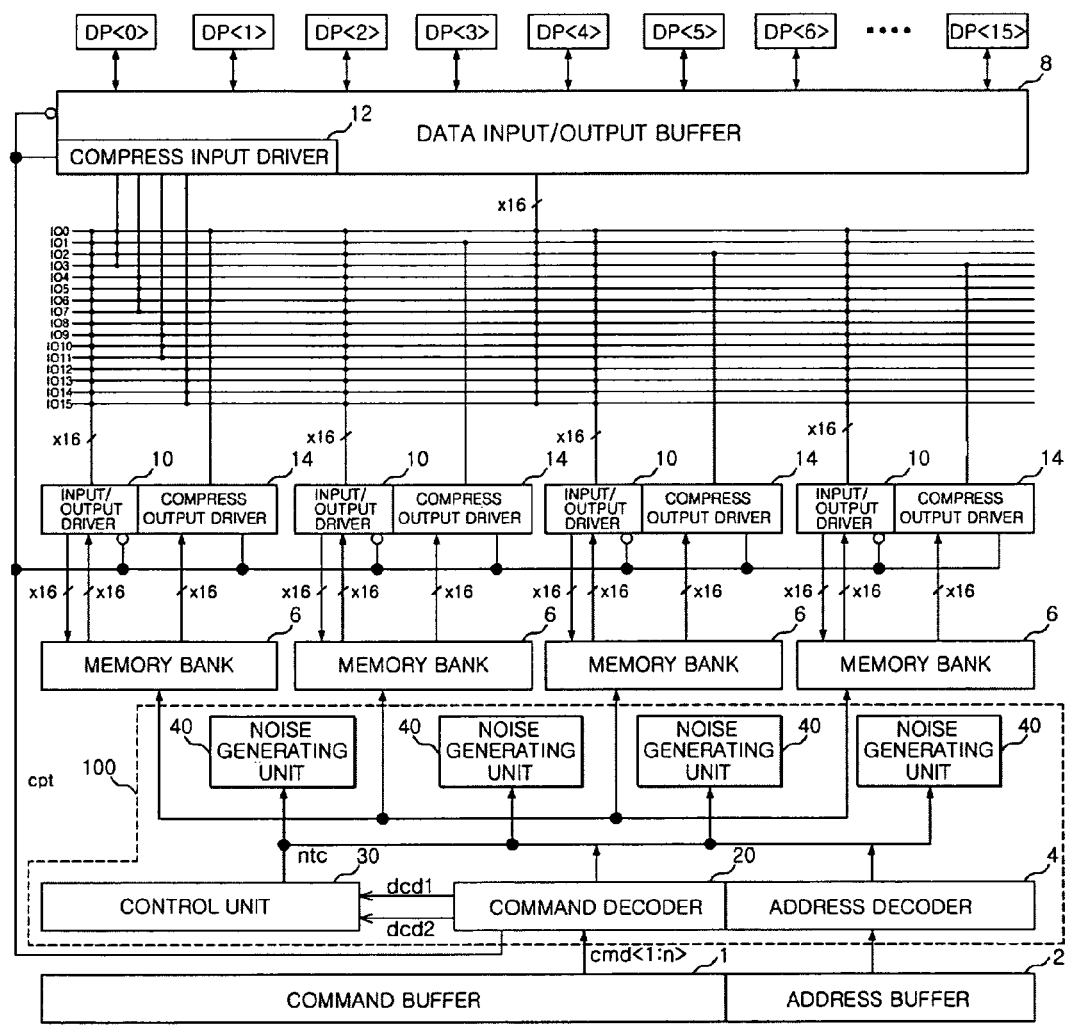
FIG. 1 is a block diagram illustrating the structure of a semiconductor memory apparatus that includes a noise generating block according to an embodiment of the present invention.

Embodiments of the present invention will now be described in detail with reference to the accompanying drawings in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity A semiconductor memory apparatus according to an embodiment of the present invention includes a noise generating block that provides a noise environment equivalent to a normal mode even in a test mode. The noise-generating block is located in a peripheral circuit area of the semiconductor memory apparatus that includes memory banks each having a plurality of memory cells and a peripheral circuit transmitting-signals to the memory banks, and may provide a noise to the memory banks.

When a test operation that generally uses a compress mode is performed, the semiconductor memory apparatus may reduce a noise difference between operating modes by generating a noise at a level where the normal mode is used. As a result, the percentage of the semiconductor apparatus defects can be reduced and reliability thereof can be improved.

The detailed structure of the above-described semiconductor memory apparatus will be described in detail with reference to FIGS. 1 and 2.

FIG. 1 is a block diagram illustrating the structure of a semiconductor memory apparatus that includes a noise generating block according to an embodiment of the present invention. FIG. 2 is a view schematically illustrating the noise generating block of FIG. 1. The semiconductor memory apparatus according to the embodiment of the present invention includes, for example, sixteen data pads DP<0> to DP<15>, sixteen input/output lines, and four memory banks 6. Further, reference numeral 1 denotes a command buffer, reference numeral 2 denotes an address buffer, reference numeral 8 denotes a data input/output buffer, reference numeral 10 denotes an input/output driver, 12 denotes a compress input driver, and reference numeral 14 denotes a compress output driver.

Figure 2:
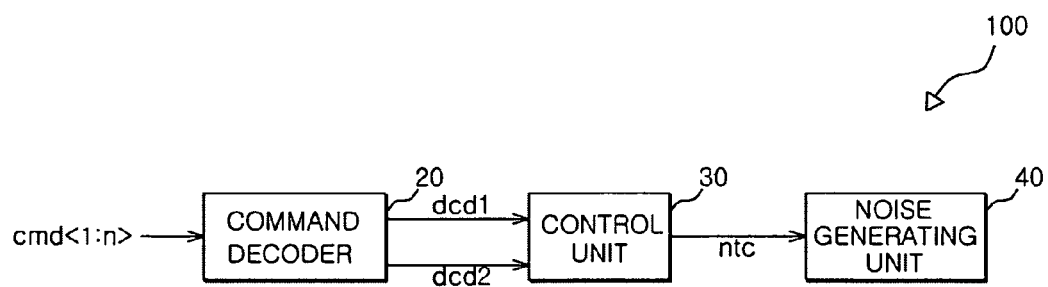
FIG. 2 is a block diagram illustrating the noise generating block shown in FIG. 1.

Referring to FIGS. 1 and 2, a noise generating block 100 of the semiconductor memory apparatus-includes a command decoder 20, a control unit 30, and noise generating units 40.

The command decoder 20 decodes a plurality of commands cmd<1:n> to generate first and second decoding signals dcd1 and dcd2, and outputs them. The first decoding signal dcd1 is a signal that is generated by decoding a mode register set signal mrs so as to instruct a noise test mode to begin. The second decoding signal dcd2 is a signal that is generated by decoding a CKE (clock enable) signal, a /CS (chip select) signal, or an arbitrary test signal that is input through a pin provided for the test. However, the method of generating the first and second decoding signals dcd1 and dcd2 is not limited to the above-described method. Here, it is assumed that the second decoding signal dcd2 is a low enable signal.

Figure 3:
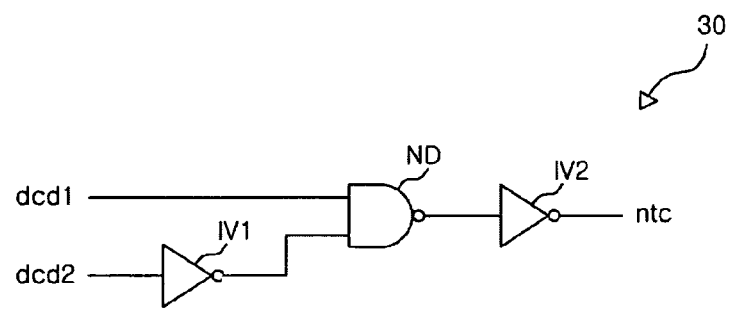
FIG. 3 is a circuit diagram illustrating the detailed structure of the control unit shown in FIGS. 1 and 2.

The control unit 30 generates a noise test control signal ntc corresponding to the input of the first and second decoding signals dcd1 and dcd2. That is, in case the first decoding signal dcd1 and the second decoding signal dcd2 are enabled at the same time, the noise test control signal ntc that is output from the control unit 30 is enabled. As shown in FIG. 3, the control unit 30 includes, for example, a first inverter IV1 that receives the second decoding signal dcd2, a NAND gate ND that receives an output signal of the first inverter IV1 and the first decoding signal dcd1, and a second inverter IV2 that inverts an output signal of the NAND gate ND. Here, since the second decoding signal dcd2 is the low enable signal, the second decoding signal dcd2 is enabled at a low level. Then, when the first decoding signal dcd1 is enabled, the noise test control signal ntc is enabled. However, in the other cases, the noise test control signal ntc is disabled. The enable time of the noise test control signal ntc is determined according to the enable time of the second decoding signal dcd2. That is, the first decoding signal dcd1 is the signal that is generated by decoding the mode register set signal mrs so as to instruct the noise test mode to begin, and the second decoding signal dcd2 is the signal that is generated by decoding a command signal, such as the CKE signal or the like, so as to determine the enable time of the noise test control signal ntc. Therefore, in the noise test mode, the control unit 30 enables and outputs the noise test control signal ntc while the command signal is enabled.

The noise generating unit 40 generates a noise by generating an internal current according to whether the noise test control signal ntc is enabled or not. At least one noise generating units 40 may be provided, and preferably, the number of noise generating units 40 may be the same as the number of the memory banks 6. The generated noise affects the memory banks 6. That is, the current generated in the noise generating units 40 affects element components and lines that form the memory banks 6. Therefore, the characteristics and amount of noise that is generated by the noise generating units 40 are associated with the distance between the noise generating units 40 and the memory banks 6. Therefore, the position of the noise generating units 40 is an important factor in determining the characteristics and amount of noise. Accordingly, it is preferable that the noise generating units 40 be disposed at an appropriate position within the peripheral circuit unit, in consideration of the characteristics and amount of noise in the normal mode and the test mode.

Figure 4:
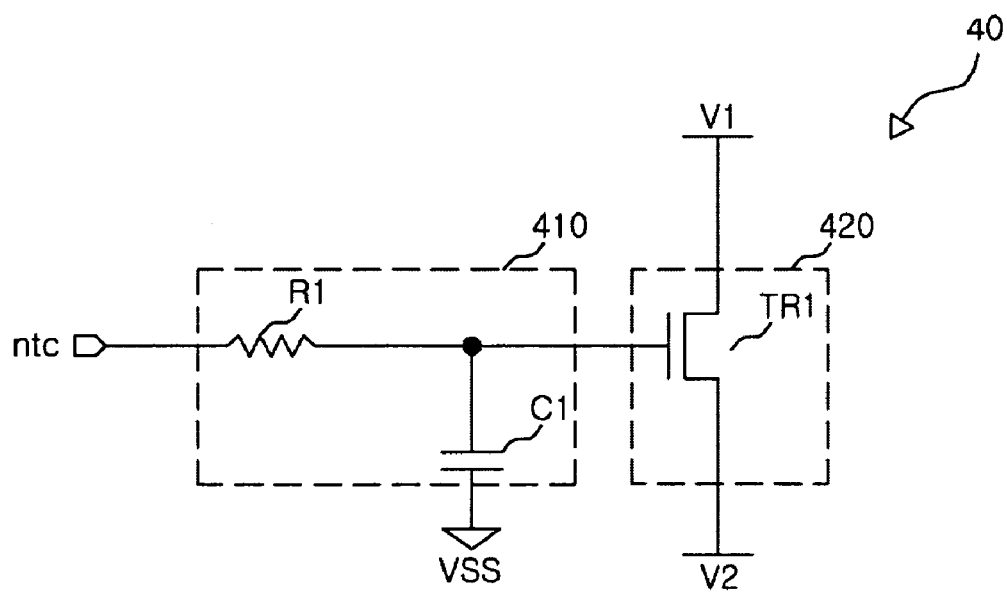
FIG. 4 is a first exemplary circuit diagram illustrating the structure of a noise generating unit shown in FIGS. 1 and 2.

Referring to FIG. 4, the noise-generating unit 40 includes a delay unit 410 and a current generating unit 420. The delay unit 410 controls the speed at which the noise test control signal ntc is supplied to the current generating unit 420. The delay unit 410 is configured in the form of an RC delay unit that includes a resistor R1 and a capacitor C1. The delay unit 410 converts the noise test control signal ntc into a signal, which is gently inclined, by combining the first resistor R1 and the first capacitor C1.

The current generating unit 420 may include a single transistor TR1. The transistor TR1 that forms the current generating unit 420 has a gate, to which an output signal of the delay unit 410 is input, that is, the noise test control signal ntc that is delayed by a predetermined time, a drain to which a first voltage V1 is applied, and a source to which a second voltage V2 is applied. Here, the first voltage V1 may be a voltage supplied from an external power supply VDb, and the second voltage V2 may be a ground voltage. However, the present invention is not limited thereto. In the current generating unit having the above-described structure, when the signal is supplied to the gate of the transistor TR1 from the delay unit 410, the current-flows through the transistor TR1 according to a potential difference between a terminal of the first voltage V1 and a terminal of the second voltage V2.

Figure 5:
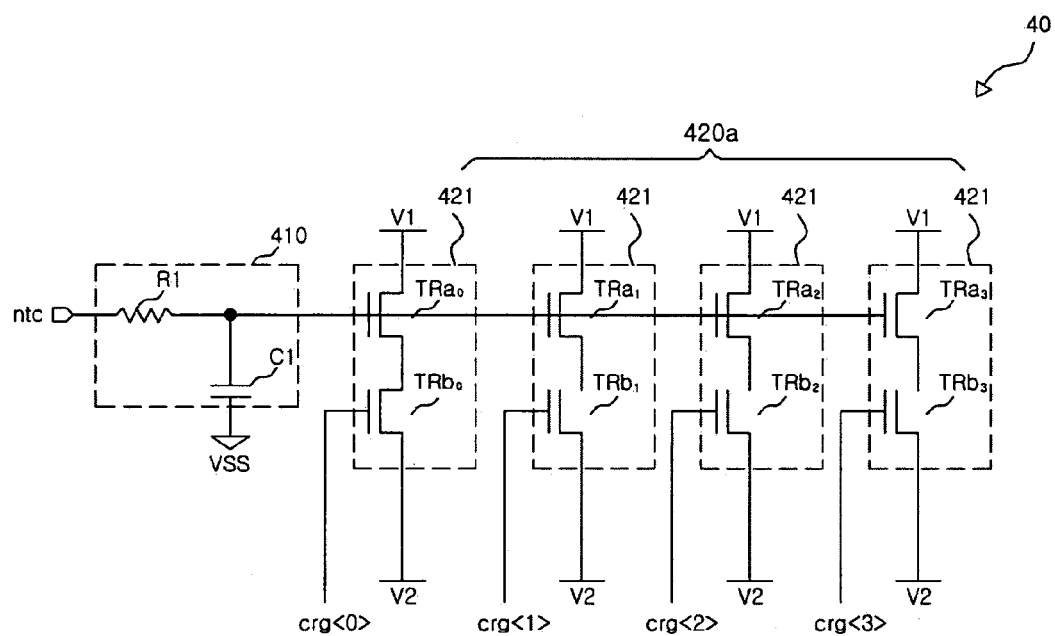
FIG. 5 is a second exemplary circuit diagram illustrating a structure of the noise generating unit shown in FIGS. 1 and 2.

Further, as shown in FIG. 5, the current generating unit 420a includes a plurality of sub current generating units 421. There may be, for example, four sub current generating units 421. The sub current generating units 421 include first transistors TRa<0:3> and second transistors TRb<0:3> that are connected between the terminal of the first voltage V1 and the terminal of the second voltage V2. The first transistors TRa<0:3> have respective gates to which the delayed noise test control signal ntc is commonly input, and respective drains connected to the terminal of the first voltage V1. The second transistors TRb<0:3> have gates to which corresponding current generation signals crg<0:3> are respectively input, drains-connected to the respective sources of the first transistors TRa<0:3>, and sources connected to the terminal of the second voltage V2. The current generation signals crg<0:3> are signals that are selectively enabled so as to control the amount of current that is generated by the current generating unit 420. Further, the current generation signals crg<0:3> are artificially generated by using a apparatus, such as a fuse circuit, according to the amount of noise to be generated in the test mode. The total amount of current of the sub current generating units 421 is determined by the number of current generation signals crg<i> that are enabled among the current generation signals crg<0:3> in a state where the noise test control signal ntc is enabled. That is, the number of current generation signals crg<i> to be enabled is determined according to the amount of noise to be generated by the noise generating unit 40.

The semiconductor memory apparatus having the above-described structure creates a noise environment, whose noise level is the same as that generated in the normal mode, by artificially generating a noise using the noise generating unit 40 in the test mode. The noise environment may be determined according to the position of the noise generating block, and preferably, the position of the noise generating unit. The total amount of noise can be varied according to the internal structure of a noise generating circuit. That is, according to the structure and disposition of the noise generating circuit, the noise environment of the test mode can be the same as that of the normal mode. As such, when the amount of noise that is generated in the wafer test step of the semiconductor memory apparatus is the same as the amount of noise that is generated in the test step after the packaging process, it is possible to reduce the percentage of defects when the semiconductor memory apparatus are manufactured.

A semiconductor memory apparatus having the above-described noise generating block decodes a plurality of commands and generates the noise test control signal in the wafer test step that is performed in the compress mode. The noise test signal makes transistor turn on the transistor, to generate a penetrating-current in the transistor. The noise is generated by the penetrating-current of the transistor. Therefore, a noise environment equivalent to the noise environment in the normal mode can also be created in the test mode.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such the metes and bounds are therefore intended to be embraced by the claims.

As described above, according to the embodiment of the present invention, the noise environment in the test mode can be made similar to the noise environment in the normal-mode, such that test reliability can be improved and defects can be reduced.

What is claimed is:

1. A semiconductor memory apparatus comprising:
   memory banks, each of which includes a plurality of memory cells;
   a peripheral circuit unit that includes a plurality of circuit groups around the memory banks; and
   a noise generating block that is disposed in the peripheral circuit unit and selectively applies a noise to the memory banks in a test mode,
   wherein the noise generating block includes:
   a command decoder that decodes a plurality of commands;
   a control unit that generates a noise test control signal corresponding to an output signal of the command decoder; and
   a noise generating unit that generates a current according to whether the noise test control signal of the control unit is enabled or not,
   wherein the noise test control signal is generated by a signal that sets a noise test mode obtained by decoding the plurality of commands, and a signal that sets an enable interval of the noise test control signal in the noise test mode.

2. The semiconductor memory apparatus of claim 1, wherein the output signal of the command decoder is an enable signal for setting the noise test mode.

3. The semiconductor memory apparatus of claim 1, wherein the output signal of the command decoder is a signal that is generated by decoding a mode register set (mrs) signal.

4. The semiconductor memory apparatus of claim 1, wherein the output signal of the command decoder is a signal that is enabled so as to generate the noise test control signal in the noise test mode.

5. The semiconductor memory apparatus of claim 4, wherein the signal output from the command decoder is a signal that is generated from a CKE (Clock enable) signal or a /CS (chip select) signal.

6. The semiconductor memory apparatus of claim 1, wherein the control unit includes a NAND gate that receives the signal output from the command decoder.

7. The semiconductor memory apparatus of claim 1, wherein the noise generating unit includes:
   a delay unit that controls the speed of the noise test control signal which is supplied; and
   a current generating unit that generates a current between a first voltage terminal and a second voltage terminal according to the input of the noise test control signal that is supplied from the delay unit.

8. The semiconductor memory apparatus of claim 7, wherein the delay unit is configured in the form of an RC delay unit that includes a resistor and a capacitor.

9. The semiconductor memory apparatus of claim 7, wherein the current generating unit includes a transistor that has a gate terminal which is connected to the delay unit, a drain terminal to which the first voltage is applied, and a source terminal to which the second voltage is applied.

10. The semiconductor memory apparatus of claim 7, wherein the current generating unit includes a plurality of sub current generating units that generate a current between the first voltage terminal and the second voltage terminal.

11. The semiconductor memory apparatus of claim 10, wherein each of the sub current generating units includes:
   a first transistor that has a gate to which the output signal of the delay unit is input, and a drain connected to the first voltage terminal; and
   a second transistor that has a drain connected to the source of the corresponding first transistor, a gate to which a corresponding current generation signal is input, and a source connected to the second voltage terminal.

12. The semiconductor memory apparatus of claim 7, wherein the first voltage is a voltage supplied from an external power supply VDD, and the second voltage is a ground voltage VSS.

13. A semiconductor memory apparatus comprising:
   memory banks, each of which includes a plurality of memory cells;
   a peripheral circuit unit that includes a plurality of circuit groups around the memory banks; and
   a noise generating block that is disposed in the peripheral circuit unit, which includes a command decoder decoding a plurality of commands, a control unit generating a noise test control signal according to an output signal of the command decoder, and a noise generating unit generating a current according to whether the noise test control signal of the control unit is enabled or not, wherein the noise generating unit includes a delay unit that controls a supplying speed of the noise test control signal, and at least one transistor that generates a current between a first voltage terminal and a second voltage terminal according to the input of the noise test control signal supplied from the delay unit, wherein the noise test control signal is generated by a signal that sets a noise test mode obtained by decoding the plurality of commands, and a signal that sets an enable interval of the noise test control signal in the noise test mode.

14. A method of testing a semiconductor memory apparatus, comprising:

generating a noise test control signal by decoding a plurality of commands, when a semiconductor wafer is tested; and generating a penetrating-current in a transistor that performs a switching operation according to whether the noise test control signal is enabled or not, to create a noise by the penetrating-current, wherein the noise test control signal is generated by a signal that sets a noise test mode obtained by decoding the plurality of commands, and a signal that sets an enable interval of the noise test control signal in the noise test mode.

15. The method of claim 14, wherein the signal that sets the noise test mode is generated by decoding a mode register set signal.

16. The method of claim 14, wherein the signal that sets the enable interval of the noise test control signal is generated from a CKE (clock enable) signal or a /CS (inverted chip select) signal.

17. The method of claim 14, wherein the through-current is generated by a potential difference between a voltage supplied from an external power supply VDD and a ground voltage VSS.

* * * * *